United States Patent
Wang (10) Patent No.: US 9,633,858 B2
(45) Date of Patent: Apr. 25, 2017

(54) METHODS FOR FORMING SEMICONDUCTOR DEVICE

(71) Applicant: SEMICONDUCTOR MANUFACTURING INTERNATIONAL (SHANGHAI) CORPORATION, Shanghai (CN)

(72) Inventor: Xinpeng Wang, Beijing (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/871,708

(22) Filed: Sep. 30, 2015

(65) Prior Publication Data

US 2016/0104623 A1    Apr. 14, 2016

(30) Foreign Application Priority Data

Oct. 9, 2014    (CN) .......................... 2014 1 0527833

(51) Int. Cl.
| | | |
|---|---|---|
| H01L 21/3105 | (2006.01) | |
| H01L 21/28 | (2006.01) | |
| H01L 21/321 | (2006.01) | |
| H01L 29/423 | (2006.01) | |
| H01L 29/66 | (2006.01) | |
| H01L 29/788 | (2006.01) | |
| H01L 27/11524 | (2017.01) | |

(52) U.S. Cl.
CPC .. *H01L 21/28273* (2013.01); *H01L 21/31051* (2013.01); *H01L 21/3212* (2013.01); *H01L 21/32115* (2013.01); *H01L 27/11524* (2013.01); *H01L 29/42324* (2013.01); *H01L 29/42336* (2013.01); *H01L 29/66825* (2013.01); *H01L 29/7881* (2013.01)

(58) Field of Classification Search
CPC ........... H01L 29/66825; H01L 29/7881; H01L 29/42324; H01L 21/31051
See application file for complete search history.

(56) References Cited

U.S. PATENT DOCUMENTS

| 7,888,208 B2 * | 2/2011 | Sheen | ............... H01L 21/76232 438/259 |
| 2008/0003739 A1 * | 1/2008 | Lee | ................... H01L 21/76224 438/221 |

* cited by examiner

*Primary Examiner* — Amar Movva
(74) *Attorney, Agent, or Firm* — Kilpatrick Townsend and Stockton LLP (57) ABSTRACT

A method for forming a semiconductor device includes forming first and second hard mask layers overlying a semiconductor substrate and forming trenches through the second hard mask, the first hard mask, and into the substrate. A dielectric material is formed in the trenches to form shallow trench isolation regions, removing the second hard mask layer, and a floating gate material is formed overlying the first hard mask and the trenches. The method further includes repeating at least twice a process of forming a buffer layer over the floating gate material and using a polishing process to remove a portion of the buffer layer and a top portion of the floating gate material. Next, a dry etch process to remove a portion of the floating gate material above the shallow trench isolation regions and the remaining portions of the buffer layer to form floating gate structures.

16 Claims, 10 Drawing Sheets

METHODS FOR FORMING SEMICONDUCTOR DEVICE

CROSS-REFERENCES TO RELATED APPLICATIONS

This application claims priority to Chinese patent application No. 201410527833.3, filed on Oct. 9, 2014, the content of which is incorporated herein by reference in its entirety.

BACKGROUND OF THE INVENTION

The present invention relates to semiconductor technologies, and more particularly to manufacturing methods for the fabrication of semiconductor devices.

In the field of semiconductor technology, the embedded flash (E-flash) memory fabrication process is often combined with the manufacturing process for logic devices. Flash memory devices and logic devices have different technical requirements, and therefore there are often trade-offs in combining the manufacturing processes for these two types of devices.

Figure 1A:
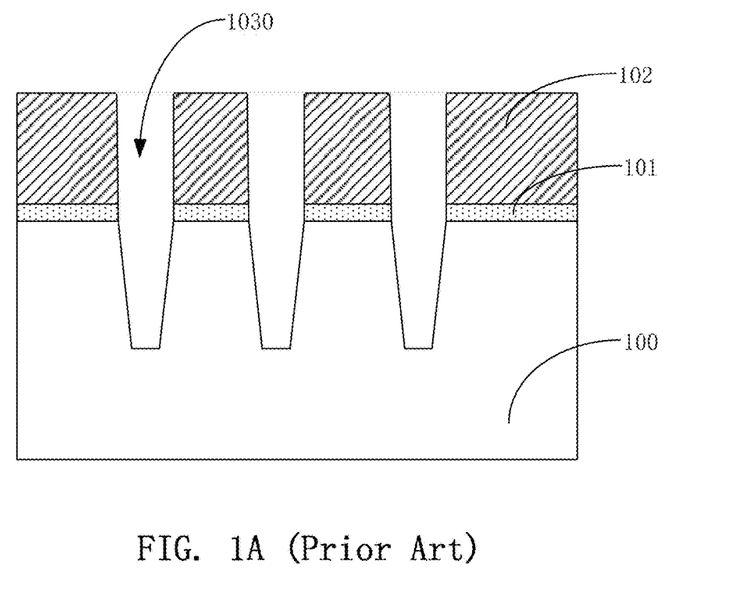
FIGS. 1A, 1B, 1C, 1D, and 1E are cross-sectional view diagrams illustrating a conventional manufacturing method of a semiconductor device.

FIGS. 1A, 1B, 1C, 1D, and 1E are cross-sectional view diagrams illustrating a conventional manufacturing method of a semiconductor device. As shown, a conventional method of manufacturing a semiconductor device can include the following steps:

Step E1: successively form a silicon oxide layer 101 and a silicon nitride layer 102 on a semiconductor substrate 100, and etch silicon nitride layer 102, silicon oxide layer 101, and semiconductor substrate 100 to form a trench, as shown in FIG. 1A.

Figure 1B:
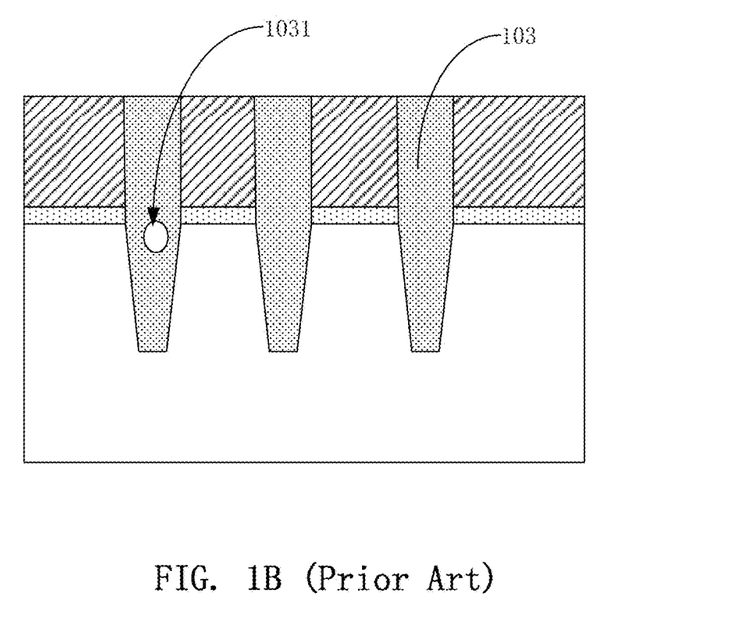

Step E2: fill trench 1030 with a dielectric material (typically silicon oxide) and perform CMP (chemical mechanical polish) to form a shallow trench isolation (STI) as shown in FIG. 1B.

Figure 1C:
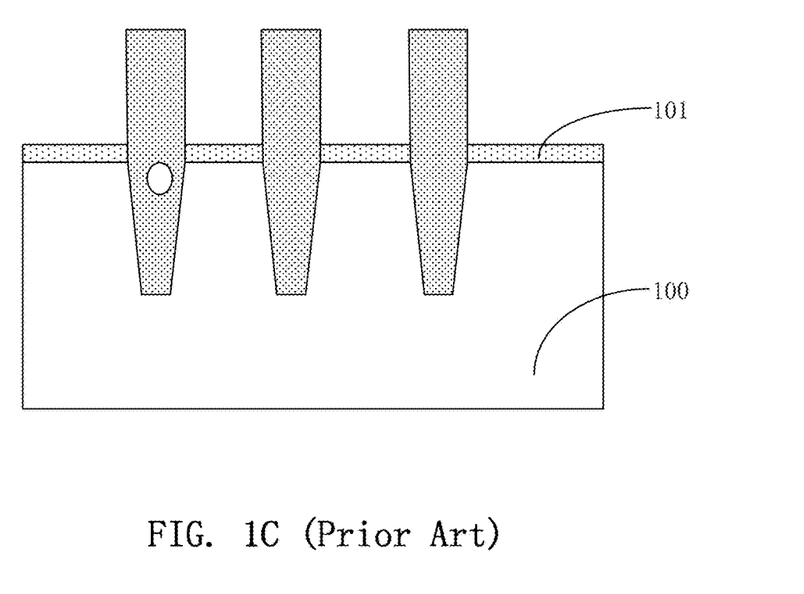

Step E3: remove silicon nitride layer 102, shown in FIG. 1C.

Figure 1D:
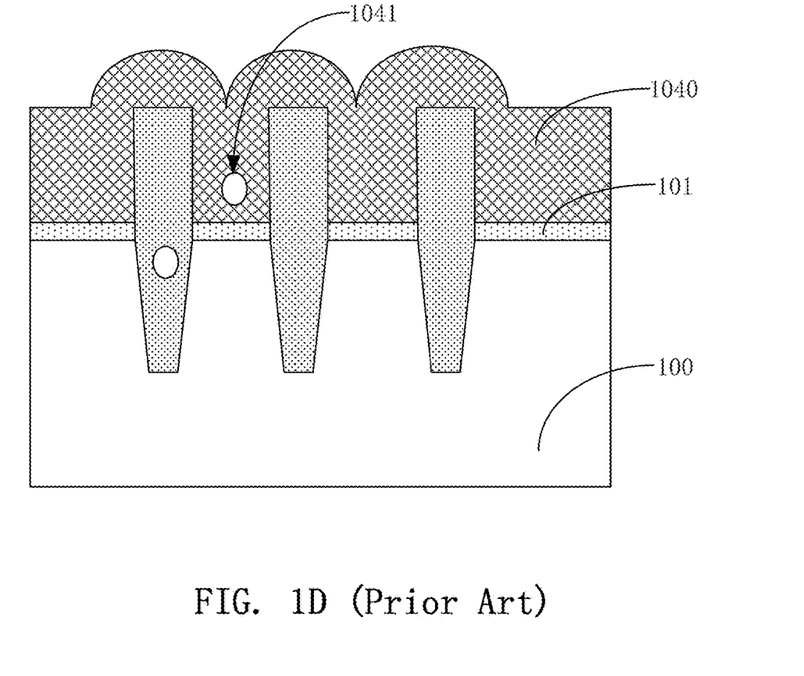
Figure 1E:
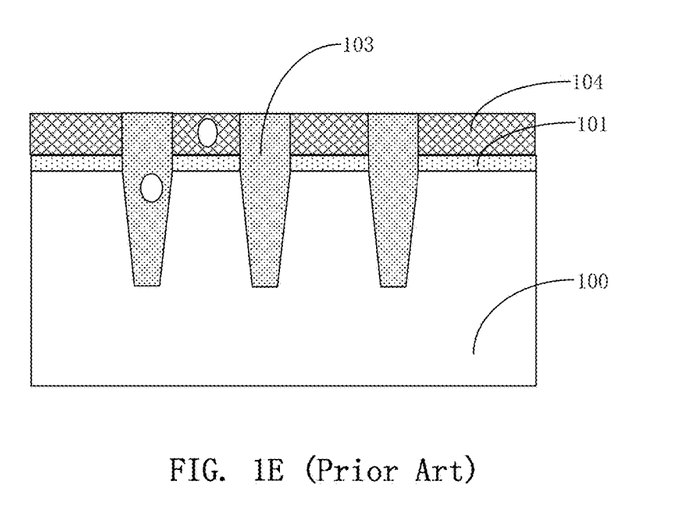

Step E4: deposit a floating gate material layer 1040 (typically polysilicon), as shown in FIG. 1D. Step E5: perform CMP on floating gate material layer 1040 to form floating gates 104, as shown in FIG. 1E.

The inventor has observed that in the conventional technology, the thickness of silicon nitride layer 102 is usually 1.5 to 2 times the final thickness of floating gate 104. The relatively large thickness of silicon nitride 102 can result in a high aspect ratio in the filler dielectric material in step E2, which often leads to the formation of cavities 1031 in shallow trench isolation 103, as shown in FIG. 1B. Similarly, floating gate 104 is also prone to cavities 1041, as shown in FIG. 1D.

Figure 2A:
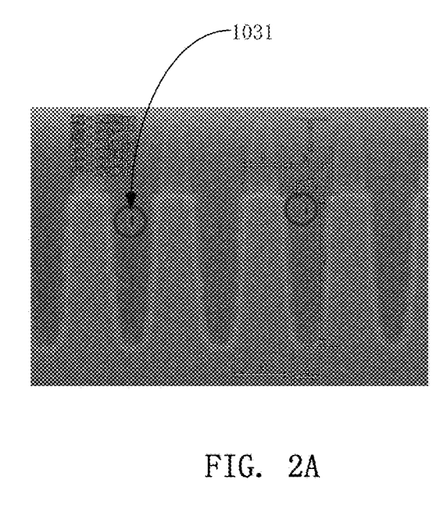
FIG. 2A is an SEM image of a conventional semiconductor device.
Figure 2B:
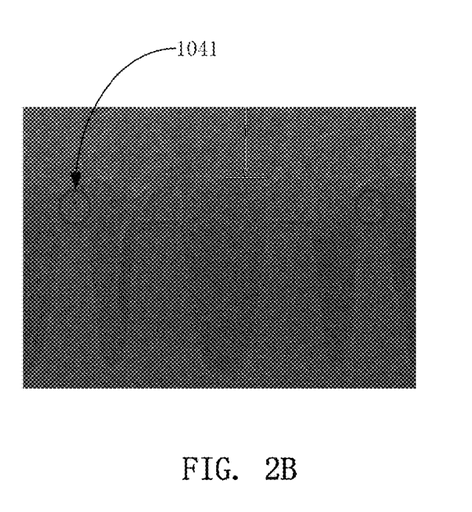
FIG. 2B is another SEM image of a conventional semiconductor device.

In the technical field, in order to ensure device performance, shallow trench isolation 103 and the floating gate 104 should be free from voids. The inventor has determined that the main consideration here is critical dimensions and aspect ratio in filling the trench. Generally speaking, large size AA (active area) regions can lead to voids in a shallow trench isolation, and in the use of self-aligned method of forming a floating gate material layer, small size AA can lead to voids within the floating gate. Thus, in order to ensure that the internal shallow trench isolation and the floating gate are free from voids, there is a need to balance the formation of shallow trench isolation and the formation of floating gate, which has a relatively narrow process window. In conventional technologies, it is often difficult to prevent voids in shallow trench isolation and the floating gate at the same time. FIGS. 2A and 2B are scanning electron microscope (SEM) photographs illustrating voids formation in conventional technologies.

Figure 2C:
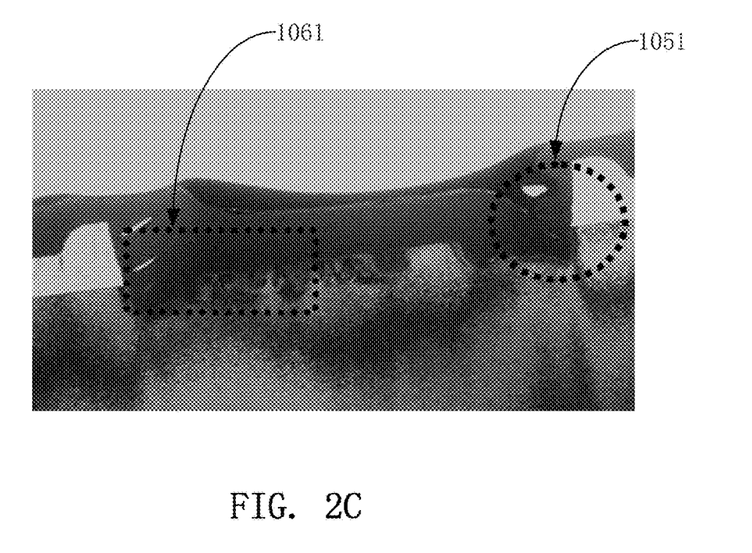
FIG. 2C is an SEM view of a conventional semiconductor device showing an AA (active area) region.

In addition, the inventor has also observed severe loading effects in the CMP process of the floating gate layer between a memory cell area and the pad area. As illustrated in the SEM photograph in FIG. 2C, the floating gate in the pad region can exhibit a relatively loss of thickness (1051), which can result in damages in the AA area 1061.

Thus, the conventional method of manufacturing a semiconductor device cannot simultaneously prevent voids formation inside shallow trench isolation and the floating gate. Further, in the conventional method, the loading effect in the CMP process often causes problems in floating gate topography. Thus, it is desirable to develop a new method of manufacturing semiconductor devices.

BRIEF SUMMARY OF THE INVENTION

Embodiments of the present invention provide a method for forming a semiconductor device. The method includes forming a first hard mask layer overlying a semiconductor substrate, forming a second hard mask layer overlying the first hard mask layer, and forming trenches through the second hard mask, first hard mask, and into the substrate. The method also includes forming a dielectric material in the trenches to form shallow trench isolation regions, removing the second hard mask layer, and forming a floating gate material overlying the first hard mask and the trenches. The method further includes repeating at least twice a process of forming a buffer layer over the floating gate material and using a polishing process to remove a portion of the buffer layer and a top portion of the floating gate material. Next, a dry etch process to remove a portion of the floating gate material above the shallow trench isolation regions and the remaining portions of the buffer layer to form floating gate structures.

In an embodiment of the above method, the process of forming a buffer layer over the floating gate material and using a polishing process to remove a portion of the buffer layer and a top portion of the floating gate material is repeated until a top surface of the remaining buffer layer is coplanar with a top surface of the remaining portion of the floating gate material.

In some embodiments, the thickness of the second hard mask is substantially equal to a desired thickness of the floating gate structures. In an embodiment, the thickness of the second hard mask layer has a range of about 200 Å to about 1000 Å.

In some embodiments, the buffer layer includes silicon oxide. In an embodiment, the thickness of the buffer layer is about 50 Å to about 500 Å. In an embodiment, the polishing process has a selectivity range of about 5:1 to about 10:1 for the buffer layer over the floating gate material.

In some embodiments, the method also includes forming the buffer layer using a chemical vapor deposition method to a thickness of about 50 Å to about 100 Å. In some embodiments, the method also includes forming the buffer layer using a selective deposition method such that the buffer layer is formed only over exposed portions of the floating gate material.

In some embodiments, the dry etch process has substantially the same etch rate for the floating gate material the buffer layer.

In some embodiments, the first hard mask layer comprises silicon oxide, and the second hard mask layer comprises silicon nitride. In some embodiments, the dielectric material in the trenches comprises silicon oxide. In some embodiments, the floating gate material comprises polysilicon.

According to some embodiments of the present invention, an electronic device includes a semiconductor device and electronic components coupled to the semiconductor device. The semiconductor device is formed by a method that includes forming a first hard mask layer overlying a semiconductor substrate, forming a second hard mask layer overlying the first hard mask layer, and forming trenches through the second hard mask, first hard mask, and into the substrate. The method also includes forming a dielectric material in the trenches to form shallow trench isolation regions, removing the second hard mask layer, and forming a floating gate material overlying the first hard mask and the trenches. The method further includes repeating a process of forming a buffer layer over the floating gate material and using a polishing process to remove a portion of the buffer layer and a top portion of the floating gate material until a top surface of the remaining buffer layer is coplanar with a top surface of the remaining portion of the floating gate material. The method also includes using a dry etch process to remove a portion of the floating gate material above the shallow trench isolation regions and the remaining portions of the first and second buffer layers.

According to another embodiment of the invention, a method for forming a semiconductor device includes forming a first hard mask layer overlying a semiconductor substrate, forming a second hard mask layer overlying the first hard mask layer, and forming trenches through the second hard mask, first hard mask, and into the substrate. The method also includes forming a dielectric material in the trenches to form shallow trench isolation regions, removing the second hard mask layer, and forming a floating gate material overlying the first hard mask and the trenches. The method includes forming a first buffer layer over the floating gate material and using a polishing process to remove a portion of the first buffer layer and a top portion of the floating gate material. The method further includes forming a second buffer layer over the floating gate material and using a polishing process to remove a portion of the second buffer layer and a top portion of the floating gate material. Next, the method includes using a dry etch process to remove a portion of the floating gate material above the shallow trench isolation regions and the remaining portions of the first and second buffer layers.

In some embodiments of the above method, the method further includes forming a third buffer layer over the floating gate material and using a polishing process to remove a portion of the third buffer layer and a top portion of the floating gate material. In some embodiments, the method also includes forming a fourth buffer layer over the floating gate material and using a polishing process to remove a portion of the fourth buffer layer and a top portion of the floating gate material.

The following description, together with the accompanying drawings, will provide further understanding of the nature and advantages of the claimed invention.

DETAILED DESCRIPTION OF THE INVENTION

The description below makes reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Embodiments of the present invention are related to the semiconductor device manufacturing method may be used in the manufacture of semiconductor devices including embedded flash memory (Flash) semiconductor devices. Some embodiments of the present invention are directed to the formation process of floating gates in flash memory devices.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Figure 3A:
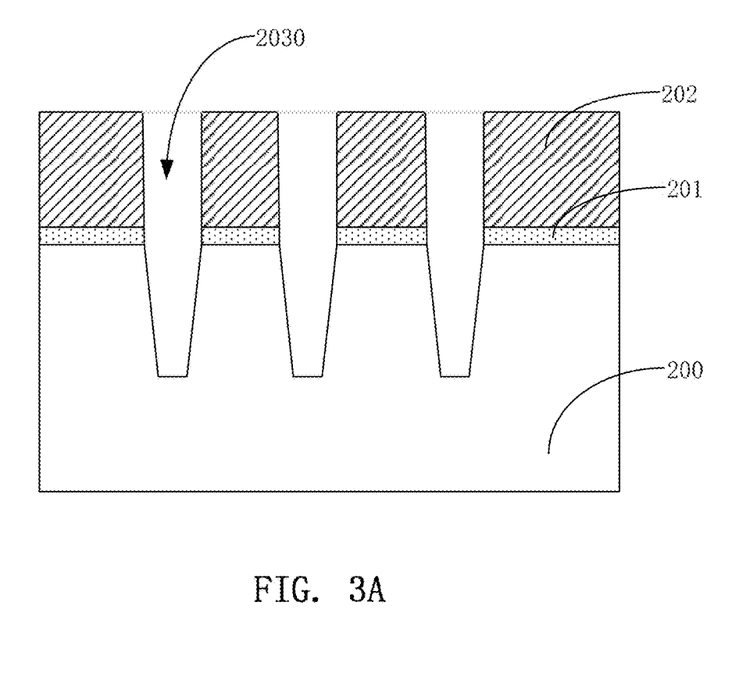
FIGS. 3A, 3B, 3C, 3D, 3E, 3F, 3G, 3H, and 3I are cross-sectional view diagrams illustrating a method for manufacturing a semiconductor device according to an embodiment of the present invention.

FIGS. 3A-3I are cross-sectional view diagrams illustrating a method for manufacturing a semiconductor device according to an embodiment of the present invention. The method includes the following steps:

Step A1: successively form a silicon oxide layer 201 and silicon nitride layer 202 on a semiconductor substrate 200, and etch silicon nitride layer 202, silicon oxide layer 201, and semiconductor substrate 200 to form a trench 2030, as shown in FIG. 3A. Semiconductor substrate 200 may be a single crystal silicon substrate, polycrystalline silicon substrate, or other suitable substrate. Silicon oxide layer 201 may be formed using a deposition method, thermal oxidation, or other suitable method. Similarly, silicon nitride layer 202 may be formed using a deposition method or other suitable method. In this embodiment, silicon oxide layer 201 is referred to as a first mask layer, and silicon nitride layer 202 is referred as a second mask layer. It is also possible to use other materials instead of silicon oxide layer 201 as the first mask layer, or to use other materials instead of the silicon nitride layer 202 as the second mask layer. In the subsequent description, silicon oxide layer 201 is referred to as a first mask layer, and silicon nitride layer 202 is referred to as a second mask layer.

In an embodiment, the thickness of silicon nitride layer 202 is substantially the same as the thickness of the ultimately formed floating gate. For example, in some embodiments, the thickness of silicon nitride layer 202 is in the range 200 to 1000 Å. In contrast, the thickness of the silicon nitride layer in the conventional methods is usually 1.5 to 2 times of the final thickness of the floating gate. In other words, in embodiments of the invention, the thickness of silicon nitride layer 202 is thinner than in the thickness of silicon nitride layer the prior art. In some embodiments, the thickness is only about 50 to 67% of the thickness in the prior art. The reduced thickness of the silicon nitride layer can improve the process window for shallow trench isolation and floating gate, which can prevent the formation of voids.

Figure 3B:
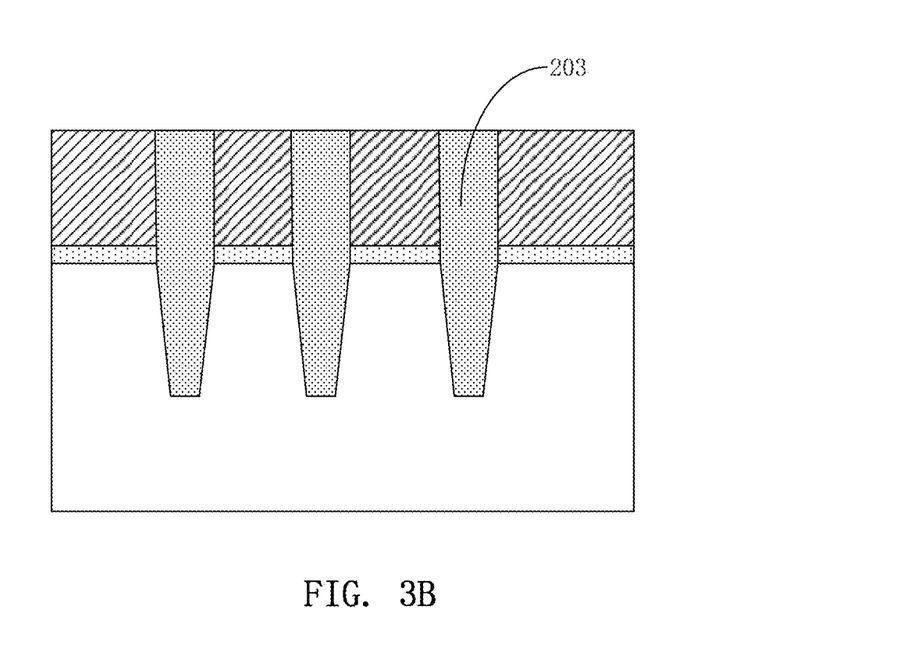

Step A2: fill trench 2030 with a dielectric material and perform a CMP process to form shallow trench isolation (STI) regions 203, as shown in FIG. 3B. Shallow trench isolation material 203 (i.e., dielectric filling material) may be silicon oxide or other suitable material. In this embodiment, since the thickness of silicon nitride layer 202 is thin relative to the prior art, the aspect ratio of the trench 2030 is reduced. This feature can help to reduce the formation of voids, as shown in FIG. 3B.

Figure 3C:
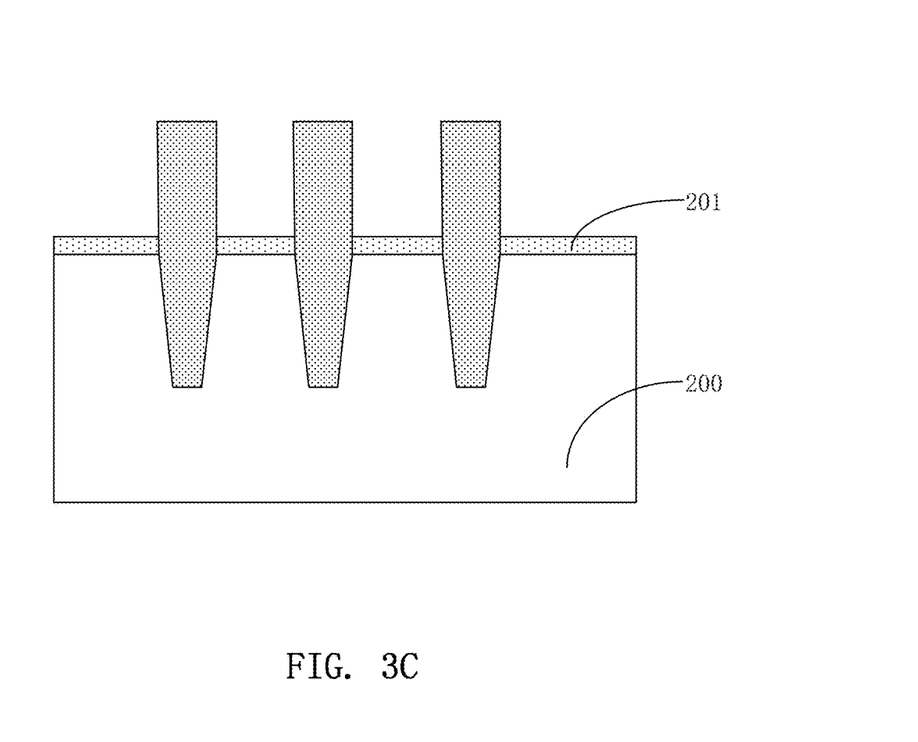
Figure 3D:
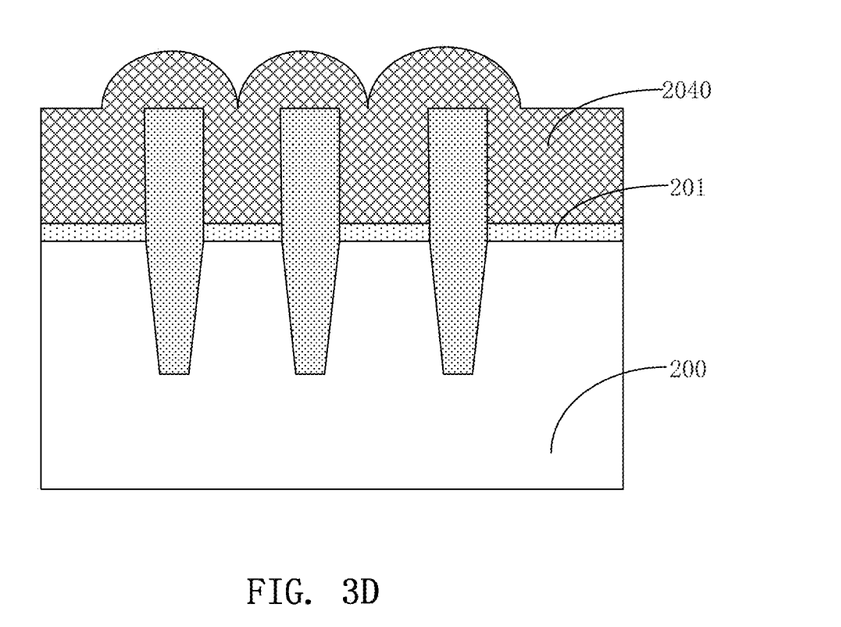

Step A3: remove silicon nitride layer 202, as shown in FIG. 3C, and form a floating gate material layer 2040 covering silicon oxide layer 201 and shallow trench isolation 203, as shown in FIG. 3D. The silicon nitride layer may be removed by etching or other suitable method. The floating gate material layer may be polysilicon, metal, or other suitable material, which can be formed using a deposition method or other suitable method. In the present embodiment, since the thickness of the silicon nitride layer is relatively thin with respect to the prior art, it is possible to prevent voids in floating gate material layer, as shown in FIG. 3D.

Figure 3E:
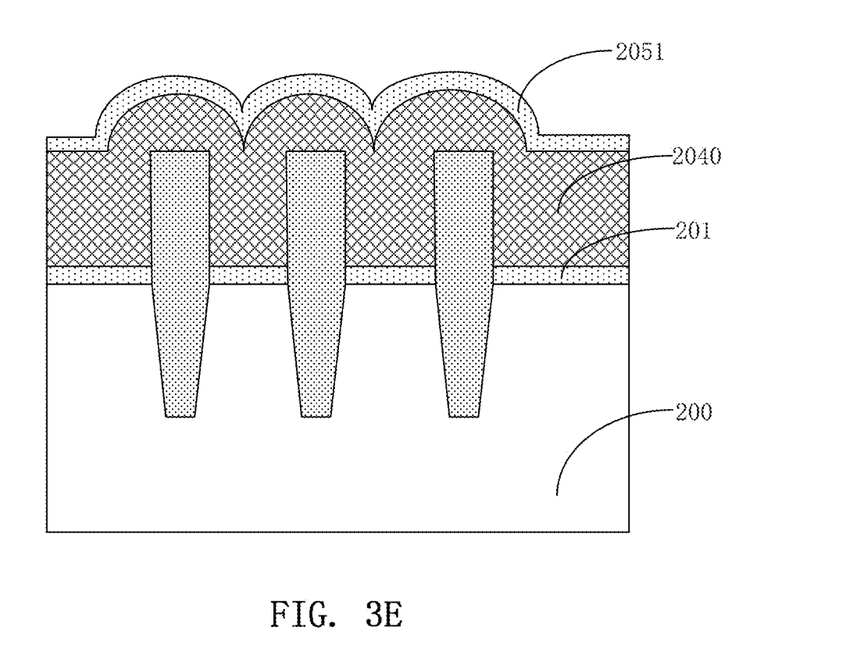
Figure 3F:
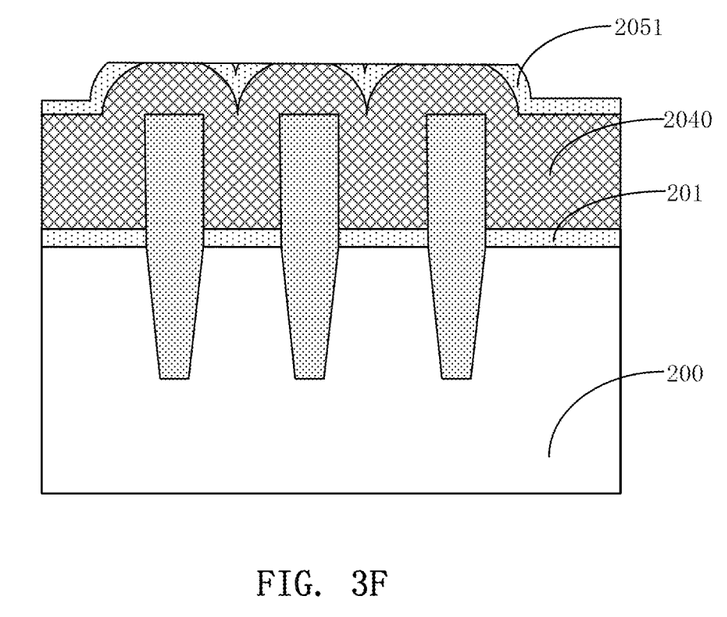

Step A4: perform at least twice a process of forming a buffer layer covering the floating gate material layer and removing part of the buffer layer and part of the floating gate material layer. As shown in FIG. 3E, a buffer layer 2051 is formed covering floating gate material layer 2040. Then, as shown in FIG. 3F, part of the buffer layer and part of floating gate material layer 2040 are removed by a CMP process. In some embodiments, this process is performed at least twice. In this step, through each process, a certain thickness of the floating gate material layer is removed. By repeating the execution of the process, the floating gate material that is higher than the shallow trench isolation is removed. The process described above may be repeated, several times, or dozens or hundreds of times, according to actual needs.

The material of the buffer layer may be silicon oxide or other suitable material. The method of forming the buffer layer may be deposition method or other suitable method. The buffer layer thickness range may be 50-500 Å. In this step, the CMP process should be controlled to have a high removal selectivity so that the buffer layer (e.g., silicon oxide) and the floating gate material layer (e.g., polysilicon), are selectively removed with a removal ratio that can range from 5:1 to 10:1.

FIGS. 3E-3H illustrate the detailed steps in which the above-described process of deposition and removal is executed twice. In the present example, the step A4 includes the following steps:

Step A41: form a buffer layer 2051 covering floating gate material 2040 as shown in FIG. 3E. The buffer layer may cover only the area exposed floating gate material layer, or it can also cover other areas. The method for forming the buffer layer can be a selective deposition method, in which the buffer layer is formed only above where the exposed areas of the floating gate material layer is. In addition, the method for forming the buffer layer can be a chemical vapor deposition method, and the buffer layer thickness can be in the range of 50-100 Å.

Step A42: use a CMP process to remove a portion of the buffer layer 2051 that is higher than the floating gate material layer and portions of the floating gate material layer 2040, as shown in FIG. 3F.

Figure 3G:
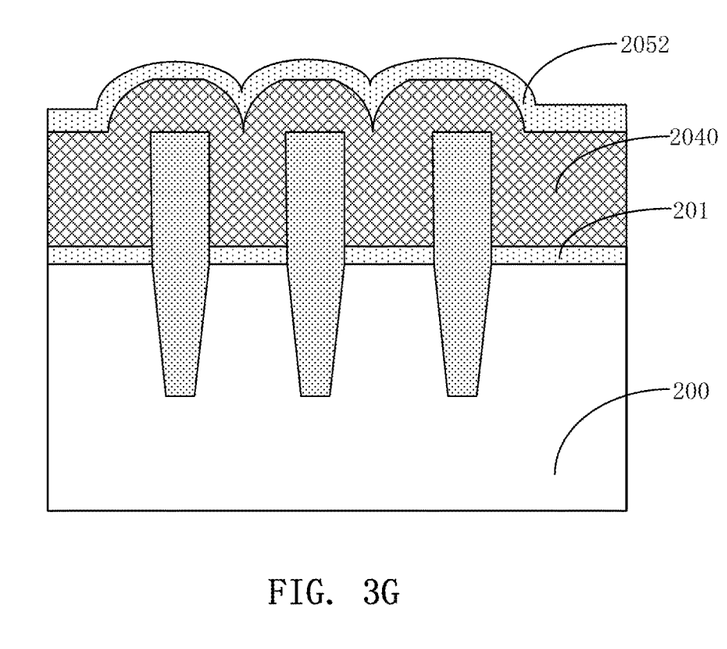

Step A43: form a buffer layer 2052 covering floating gate material layer 2040 as shown in FIG. 3G. Buffer layer 2052 may also cover remaining portions of the buffer layer 2051 located at recessed regions of floating gate material layer 2040.

Figure 3H:
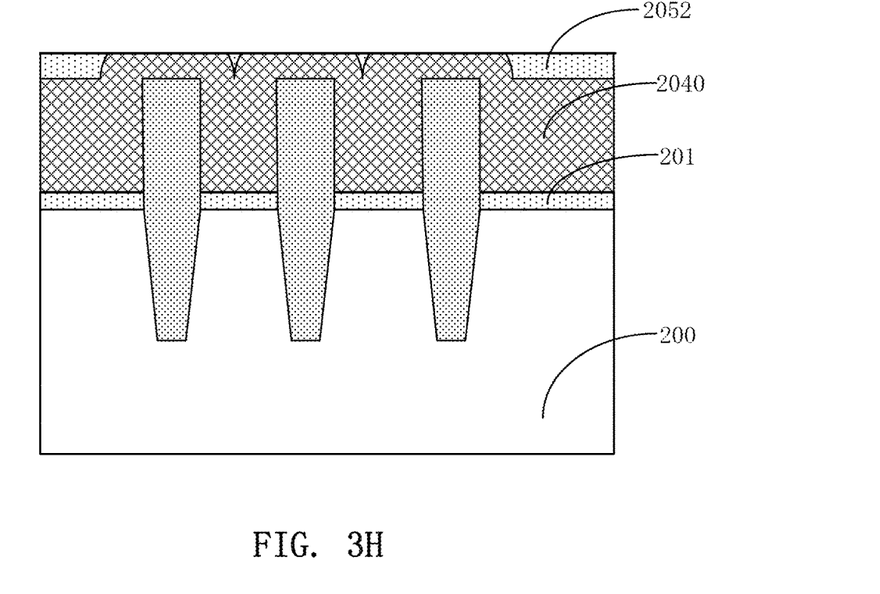

Step A44: use a CMP process to remove a portion of the buffer layer 2052 that is higher than floating gate material layer 2040 and portions of the floating gate material layer as shown in FIG. 3H. Buffer layer 2051 and buffer layer 2052 can be formed using same material.

In this embodiment, step A4 is carried out such that the remaining portion of the buffer layer material layer and the highest portion of the upper surface of the remaining portion of floating gate 2040 are at substantially the same level. This condition allows the buffer layer and the floating gate material layer to be removed at the same time in the next process step. Of course, other methods can also be used to achieve the result of step A4.

Figure 3I:
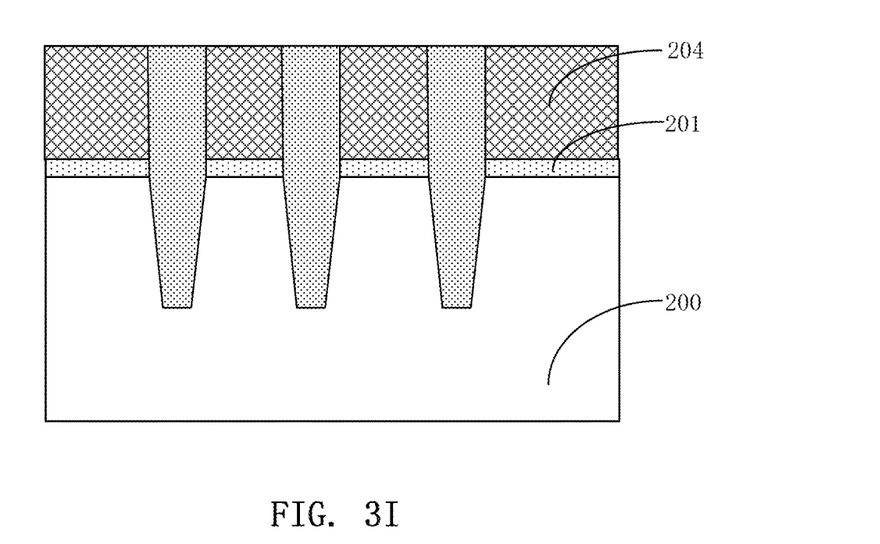

Step A5: use dry etching to remove portions of the floating gate material layer and the buffer layer above shallow trench isolation section 203 to form a floating gate 204, as shown in FIG. 3I. Here, the dry etching can be performed using the time control mode to control the shape of the floating gate. In this embodiment, the dry etching of the floating gate material layer and the buffer layer is not selective, i.e., the dry etching removes both materials at the same rate. For example, when the floating gate material layer is polysilicon and the buffer layer is silicon oxide, the dry etching chemistry is selected such that the etching of polysilicon and silicon oxide is not selective. Preferably, the dry etching of silicon nitride is relatively low. For example, suitable etching gases can be selected so that the etch selectivity of the silicon nitride over the floating gate material layer is greater than 10. Therefore, the loss of silicon nitride in this case can be negligible.

In embodiments of the present invention, multiple repetitions of "forming a first buffer layer and then performing CMP" process as described by step A4 are performed. This method can avoid by the conventional method of a single CMPs step which can cause the floating gate to lose thickness in the localized areas (typically welding panel), which can cause damage to the AA (active area) regions. Our experimental results show that, by using the process described in step A4, the thickness of the floating gate in pad regions can be improved approximately by 50 Å with respect to the conventional method. In addition, the shape of the floating gate can be improved by using the last dry etching in step A5 to remove the portion of the floating gate above the shallow trench isolation.

Figure 4:
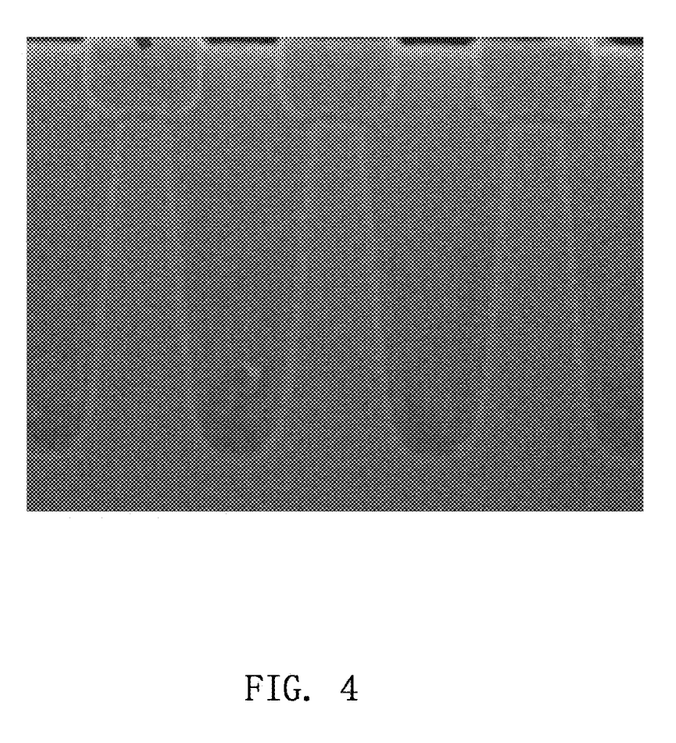
FIG. 4 is an SEM image of a semiconductor device formed using a manufacturing method according to the embodiment of the present invention.

FIG. 4 is an SEM image of a semiconductor device formed using a manufacturing method according to the embodiment of the present invention. It can be seen that a favorable morphology of the floating gate can be obtained. As a result, the floating gate coupling ratio of the semiconductor device will also be greatly improved. It can be seen that performing the step of "forming a first buffer layer and then performing CMP process" as described by step A4 at least twice can maintain desirable thickness and morphology of the floating gate, eliminate voids in the floating gate and shallow trench isolation.

Figure 5:
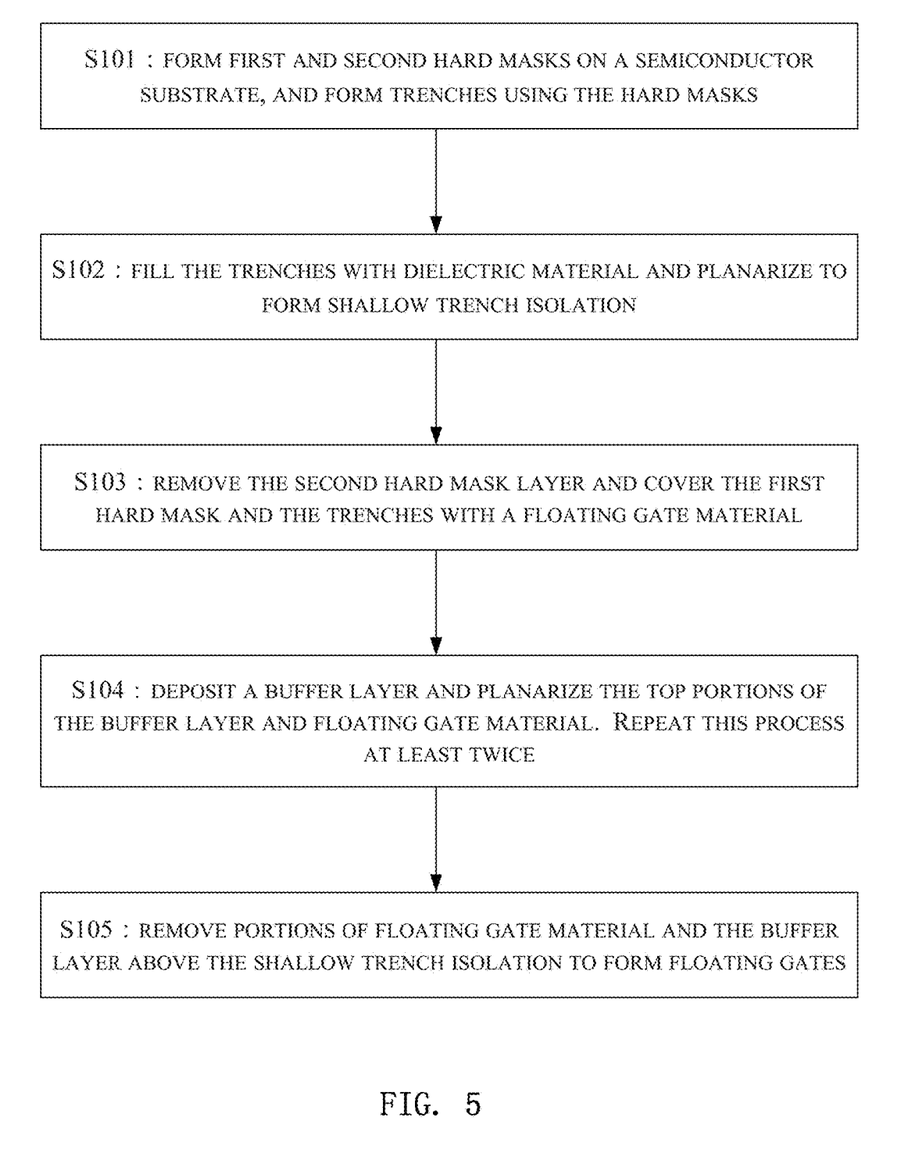
FIG. 5 is a flowchart illustrating a manufacturing method according to an embodiment of the present invention.

FIG. 5 is a flowchart illustrating a manufacturing method for a semiconductor device according to an embodiment of the present invention. As shown in FIG. 5, the method includes the following:

Step S101: form first and second hard masks on a semiconductor substrate, and form trenches using the hard masks.

Step S102: fill the trenches with dielectric material and planarize to form shallow trench isolation.

Step S103: remove the second hard mask layer and cover the first hard mask and the trenches with a floating gate material.

Step S104: deposit a buffer layer and planarize the top portions of the buffer layer and floating gate material. Repeat this process at least twice. In some embodiments, this process removes the portion of the buffer material above the floating gate material and a top portion of the floating gate material.

Step S105: remove portions of the floating gate material and the buffer layer above the shallow trench isolation to form floating gates.

An alternative embodiment of the present invention provides a semiconductor device, and electronic components connected to the semiconductor device. Here, the semiconductor device can be formed by the method of manufacturing a semiconductor device described above with reference to FIGS. 3A-3I, 4, and 5. The electronic components can include discrete devices, integrated circuits, and other electronic components, etc.

Embodiments of the present invention also provide an electronic device, including a semiconductor device and electronic components coupled with the semiconductor device. The semiconductor device is formed using a method of manufacturing a semiconductor device according to one embodiment of the semiconductor device described above. The electronic components may include any electronic components including discrete devices and integrated circuits. The electronic device can include laptops, netbooks, game consoles, televisions, VCD, DVD, navigation systems, cameras, video cameras, voice recorder, MP3, MP4, PSP and other electronic products or equipment. The electronic device of the present embodiment may also include a mobile phone, tablet PC, and it may include any intermediate product of the semiconductor device.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although certain composition structures and examples of the photo-decomposable base layer are described, it is understood that the other materials of similar properties can also be used. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for forming a semiconductor device, comprising:
   forming a first hard mask layer overlying a semiconductor substrate;
   forming a second hard mask layer overlying the first hard mask layer;
   forming trenches through the second hard mask, the first hard mask, and into the substrate;
   forming a dielectric material in the trenches to form shallow trench isolation regions;
   removing the second hard mask layer;
   forming a floating gate material overlying the first hard mask and the trenches;
   repeating at least twice a process of forming a buffer layer over the floating gate material and using a polishing process to remove a portion of the buffer layer and a top portion of the floating gate material;
   using a dry etch process to remove a portion of the floating gate material above the shallow trench isolation regions and the remaining portions of the buffer layer to form floating gate structures.

2. The method of claim 1, wherein the process of forming a buffer layer over the floating gate material and using a polishing process to remove a portion of the buffer layer and a top portion of the floating gate material is repeated until a top surface of the remaining buffer layer is coplanar with a top surface of the remaining portion of the floating gate material.

3. The method of claim 1, wherein the thickness of the second hard mask is substantially equal to a desired thickness of the floating gate structures.

4. The method of claim 1, wherein the thickness of the second hard mask layer has a range of about 200 Å to about 1000 Å.

5. The method of claim 4, further comprising:
   forming a fourth buffer layer over the floating gate material;
   using a polishing process to remove a portion of the fourth buffer layer and a top portion of the floating gate material.

6. The method of claim 1, wherein the buffer layer comprises silicon oxide.

7. The method of claim 1, wherein the thickness of the buffer layer is about 50 Å to about 500 Å.

8. The method of claim 1, wherein the polishing process has a selectivity range of about 5:1 to about 10:1 for the buffer layer over the floating gate material.

9. The method of claim 1, further comprising forming the buffer layer using a chemical vapor deposition method to a thickness of about 50 Å to about 100 Å.

10. The method of claim 1, wherein further comprising forming the buffer layer using a selective deposition method such that the buffer layer is formed only over exposed portions of the floating gate material.

11. The method of claim 1, wherein the dry etch process has substantially the same etch rate for the floating gate material as the buffer layer.

12. The method of claim 1, wherein the first hard mask layer comprises silicon oxide, and the second hard mask layer comprises silicon nitride.

13. The method of claim 1, wherein the dielectric material in the trenches comprises silicon oxide.

14. The method of claim 1, wherein the floating gate material comprises polysilicon.

15. A method for forming a semiconductor device, comprising:
   forming a first hard mask layer overlying a semiconductor substrate;
   forming a second hard mask layer overlying the first hard mask layer;
   forming trenches through the second hard mask, the first hard mask, and into the substrate;
   forming a dielectric material in the trenches to form shallow trench isolation regions;
   removing the second hard mask layer;
   forming a floating gate material overlying the first hard mask and the trenches;
   forming a first buffer layer over the floating gate material;
   using a polishing process to remove a portion of the first buffer layer and a top portion of the floating gate material;
   forming a second buffer layer over the floating gate material;
   using a polishing process to remove a portion of the second buffer layer and a top portion of the floating gate material;
   using a dry etch process to remove a portion of the floating gate material above the shallow trench isolation regions and the remaining portions of the first and second buffer layers.

16. The method of claim 15, further comprising:
   forming a third buffer layer over the floating gate material;
   using a polishing process to remove a portion of the third buffer layer and a top portion of the floating gate material.

* * * * *